United States Patent [19]
Tanaka et al.

[11] Patent Number: 5,245,620
[45] Date of Patent: Sep. 14, 1993

[54] LASER DIODE SYSTEM FOR REFLECTING AND MAINTAINING LASER LIGHT WITHIN THE SYSTEM

[75] Inventors: Haruo Tanaka; Naotaro Nakata, both of Kyoto, Japan

[73] Assignee: Rohm Co., Ltd., Kyoto, Japan

[21] Appl. No.: 938,677

[22] Filed: Sep. 1, 1992

Related U.S. Application Data

[63] Continuation of Ser. No. 691,499, Apr. 25, 1991, abandoned.

[30] Foreign Application Priority Data

Apr. 28, 1990 [JP] Japan .................................. 2-114097

[51] Int. Cl.$^5$ ................................................ H01S 3/04
[52] U.S. Cl. ........................................... 372/36; 372/49
[58] Field of Search ...................... 372/49, 50, 36, 109

[56] References Cited

U.S. PATENT DOCUMENTS 4,790,620 12/1988 Niwayama .......................... 357/19

FOREIGN PATENT DOCUMENTS 0092681 5/1985 Japan ................................ 372/108

*Primary Examiner*—James W. Davie

[57] ABSTRACT

A laser diode is provided which includes a substrate, a laser diode chip bonded on the substrate through a sub-mount, and a monitor element formed on the sub-mount. A space between a rear cleavage face of the laser diode chip and the surface of the monitor element is connected by a solid state waveguide, and the surface of the solid state waveguide is covered by a light reflecting resin layer.

11 Claims, 3 Drawing Sheets

LASER DIODE SYSTEM FOR REFLECTING AND MAINTAINING LASER LIGHT WITHIN THE SYSTEM this application is a continuation, of application Ser. No. 07/691,499 filed on Apr. 25, 1991, now abandoned.

BACKGROUND OF THE INVENTION

The present invention generally relates to a diode unit, and more particularly, to a laser diode for use in an electrical or electronic equipment.

Conventionally, in the field of laser diodes, there have been employed a so-called can-seal type and a unit type. As shown in a cross sectional view of FIG. 4, one example of such known unit type laser diodes generally includes a substrate 42, and a laser diode chip 49 die-bonded on said substrate 42 through a sub-mount 43, with a photo-diode being incorporated in the sub-mount 43 as a monitor element 47.

The monitor element 47 referred to above is arranged to receive laser light emitted from a rear cleavage face 49b of the laser diode chip 49. Based on the light receiving current (i.e. monitor current) of the monitor element 47, driving current for the laser diode chip 49 is controlled by an APC (automatic phase control) circuit so as to allow laser light output of the laser diode chip 49 to reach a predetermined value.

However, when the laser diode is made into an open type to be used in a state where it is exposed to atmosphere, there may arise such a case where an amount of light incident upon the monitor element 47 is reduced by dew formation or adhesion of dust, etc. on the surface of the monitor element, thus, making it impossible to fully detect the monitor current. In the case as referred to above, there is a possibility that the driving current continues to be increased by the APC circuit, and undesirably breaks down the laser diode chip 49 finally.

Meanwhile, in the unit type laser diode, there is such a fundamental problem that the incident angle of the laser light upon the monitor element 47 is originally small, and a sufficient amount of laser light cannot be directed into the monitor element 47.

Therefore, a solid state waveguide 50 made of a light transmitting (or semi-light transmitting) resin is provided to connect a space between a rear cleavage face 49b of the laser diode chip 49 and the surface of the monitor element 47. Within the above solid state waveguide 50, laser light is subjected to total reflection by a difference in the refractive indices at a boundary face between the resin and air so as to be incident upon the monitor element 47.

On the sub-mount 43, an aluminum wiring pads 45 conducted to the laser diode chip 49 and the monitor element 47 is formed so as to be bonded to leads (not shown) on a flexible circuit 52 by a wire W.

In the conventional laser diode as described above, the shape of the solid state waveguide 50 has influence upon the light amount to be received by the monitor element. Since the solid state waveguide 50 is formed by applying resin in a liquid state into the space referred to above for subsequent hardening, the shape thereof differs one by one, and there may be a case where an angle of incidence of the laser light with respect to the boundary face (surface of the solid state waveguide means) between the resin and air becomes large, and thus, part of the laser light is transmitted outside the solid state waveguide 50. In such a case, there is a problem that the amount of light incident upon the monitor element 47 is reduced, and a sufficiently large monitor current cannot be obtained.

Another disadvantage of the conventional laser diode is such that, when the laser diode is formed into an open construction without covering, the surface of the solid state waveguide 50 is exposed to the atmosphere for a long period, and the state of its surface i.e. of its boundary face is altered, so as to vary light amount incident upon the monitor element 47 with consequent variation in the monitor current. In some cases, such a problem may also result from dew formation, adhesion of dust, etc., on the surface of the solid state waveguide 50.

SUMMARY OF THE INVENTION

Accordingly, an essential object of the present invention is to provide a laser diode which is capable of obtaining a sufficient amount of monitor current, with variation thereof being simultaneously prevented.

Another object of the present invention is to provide a laser diode of the above described type which is simple in construction, and stable in functioning, and can be readily manufactured on a large scale at low cost.

In accomplishing these and other objects, according to one preferred embodiment of the present invention, there is provided a laser diode which includes a substrate, a sub-mount disposed on a portion of the substrate, a laser diode chip bonded on the sub-mount, and a monitor element formed on the sub-mount, with a space between a rear cleavage face of said laser diode chip and the surface of said monitor element being connected by solid state waveguide means. The surface of the solid state waveguide means is completely covered by a light reflecting resin layer.

In the laser diode according to the present invention as described above, even when the laser light is transmitted outside the solid state waveguide means, it is reflected within the reflective resin layer so as to be again returned into the solid state waveguide means, and received by the monitor element. Accordingly, the light amount incident upon the monitor element is not readily affected by the shape of the solid state waveguide means, thus making it possible to provide a sufficient monitor current.

Meanwhile, since the surface of the solid state waveguide means is covered by the reflective resin layer, and cut off from the atmosphere, it is free from change in quality, dew formation, adhesion of dust, etc., with variation of the monitor current being also prevented.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS OF THE PRESENT INVENTION

Figure 1A:
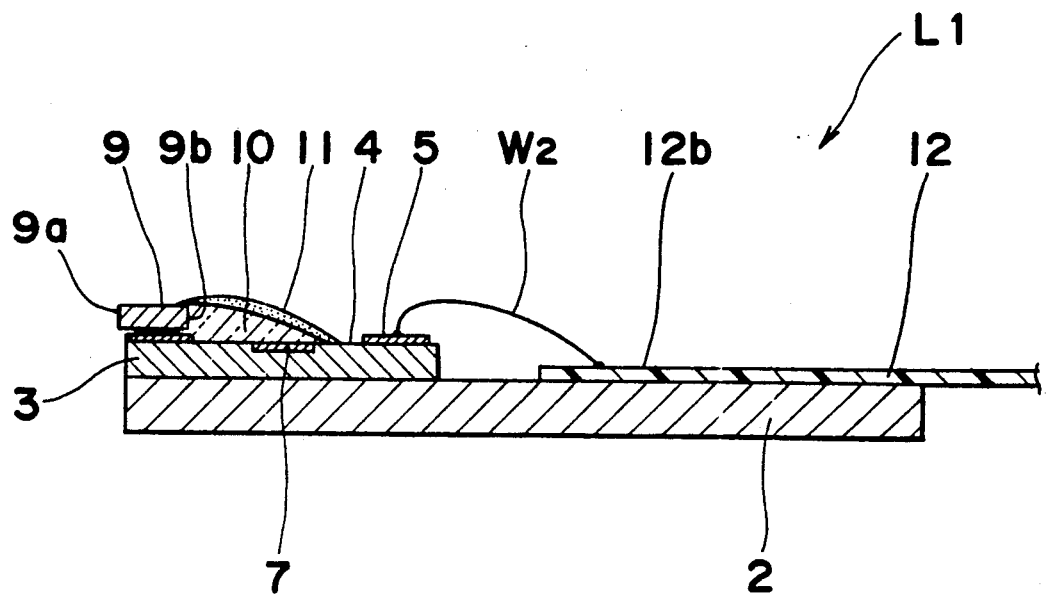
FIG. 1(A) is a side sectional view of a laser diode in a unit type according to one preferred embodiment of the present invention.

Before the description of the present invention proceeds, it is to be noted that like parts are designated by like reference numerals throughout the accompanying drawings.

Figure 2:
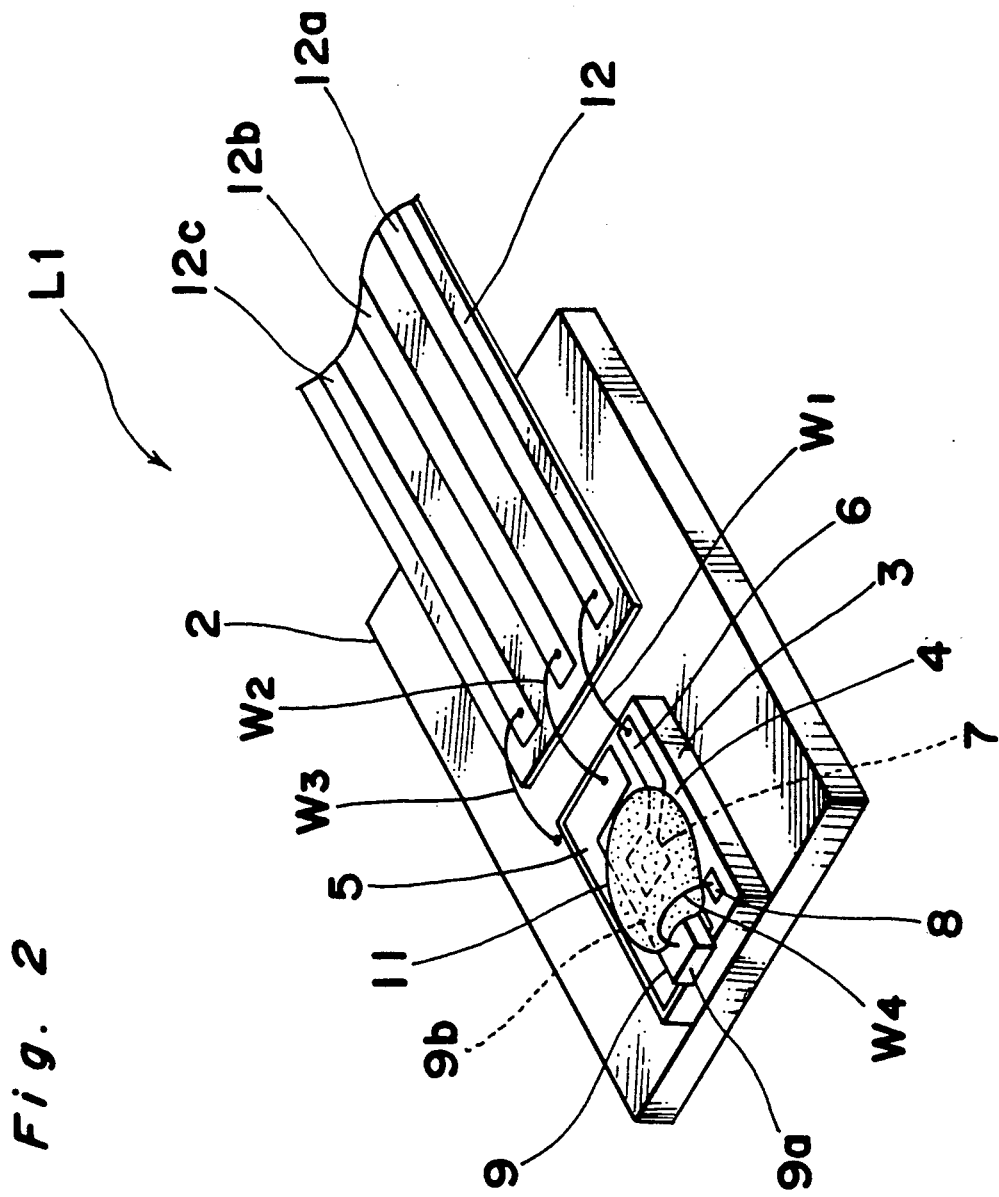
FIG. 2 is a perspective view of the laser diode shown in FIG. 1(A)

Referring now to the drawings, there is shown in FIGS. 1(A) and 2, a laser diode L1 according to one preferred embodiment of the present invention.

The laser diode L1 of a so-called unit type generally includes a substrate or base 2, a laser diode chip 9 bonded on the substrate 2 through a sub-mount 3, and a monitor element 7 formed on the sub-mount 3.

The substrate 2 is prepared by applying nickel plating and gold plating over the surface of an aluminum plate. At a central portion on the forward portion (left side in FIGS. 1(A) and 2) of the substrate 2, the sub-mount 3 is fixedly disposed by a connecting material such as indium or the like. The sub-mount 3 fundamentally constituted by a rectangular plate material of silicon is formed, on its surface, with an aluminum wiring 5 for supplying power to the laser diode chip 9 and another aluminum wiring 6 for deriving electric current produced on the sub-mount 3 by the action of the monitor element 7 to be described more in detail later, through a silicon dioxide film 4 provided over the surface of the sub-mount 3.

Towards a forward end central portion of the sub-mount 3, the aluminum wiring 5 extends to form a bonding surface, on which the laser diode chip 9 is bonded by an electrically conductive brazing material (not shown). In the above case, two cleavage faces i.e. front and rear cleavage faces 9a and 9b of the laser diode chip 9 are respectively directed towards the front and rear sides of the sub-mount 3.

Meanwhile, at the central portion on the surface of the sub-mount 3, i.e. at a region adjacent to the rear cleavage face 9b of the laser diode chip 9, a photo-diode element, which functions as the monitor element 7, is integrally constituted by forming a PN junction through diffusion of a P type impurity from the surface of the sub-mount 3. The monitor element 7 is associated with the aluminum wiring 6.

The aluminum wirings 5 and 6 are respectively bonded to corresponding leads 12a and 12b on a flexible circuit 12 connected onto the substrate 2, by wires W1 and W2, while a negative electrode of the laser diode chip 9 is bonded by a wire W4, to a pad 8 conducted inside by partly cutting open the silicon dioxide film 4 on the sub-mount 3, and is thus electrically conducted to the substrate 2. The substrate 2 is further bonded to a lead 12c of the flexible circuit 12 by a wire W3.

In the laser diode L1 as described so far, a light-transmitting or semi-light transmitting solid state waveguide 10 is applied in a space between the rear cleavage face 9b of the laser diode chip 9 and the surface of the monitor element 7 for connection.

Such a solid state waveguide 10 is formed by applying a resin material in a liquid state, e.g. silicon resin or epoxy resin or the like so as to cover both the rear cleavage face 9b and the surface of the monitor element 7 for subsequent hardening.

Furthermore, a light reflective resin layer 11 is formed so as to cover the solid state waveguide 10. The material of such light reflecting resin layer 11 is prepared by dispersing a scattering agent such as a white pigment (rutile, etc.) or titanium oxide or the like in a resin, e.g. silicon resin, epoxy resin or the like.

In the laser diode L1 according to the foregoing embodiment, some of the laser light emitted from the rear cleavage face 9b of the laser diode chip 9 is incident upon the monitor element 7 directly, or after being reflected at a boundary face between the solid state waveguide 10 and the reflecting resin layer 11, while the other of the laser light proceeds through the solid stat waveguide 10 to be incident upon the inner side of the reflecting resin layer 11, and after being scattered and reflected by the white pigment, etc. in the reflecting resin layer 11, returns again into the solid state waveguide 10 so as to be subsequently incident upon the monitor element 7. Since the laser light is reflected by the light reflecting resin layer 11, an ample incident light amount to the monitor element 7 may be achieved, and thus, a sufficient monitor current of the monitor element 7 can be obtained.

Meanwhile, owing to the fact that the surface of the solid state waveguide 10 is covered by the reflecting resin layer 11 for being cut off the atmosphere, quality deterioration on the surface of the solid state waveguide 10 is prevented, with simultaneous prevention of dew formation, adhesion of dusts, etc. Therefore, the amount of light incident upon the monitor element 7 is stabilized for less variation of the monitor current.

Figure 1B:
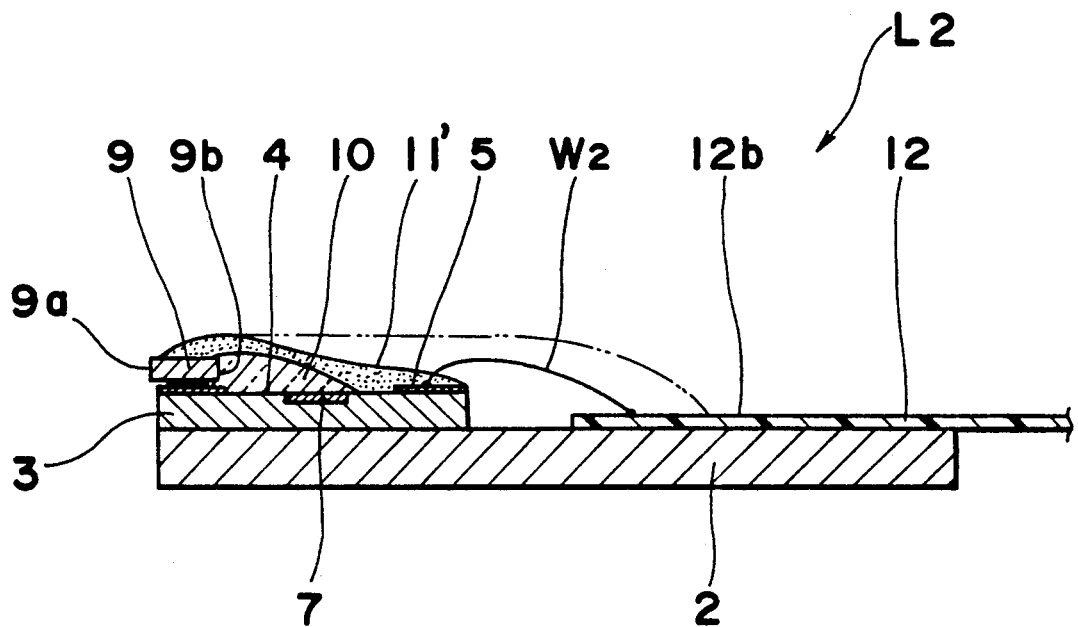
FIG. 1(B) is a view similar to FIG. 1(A), which particularly shows a modification thereof.

Referring also to FIG. 1(B), there is shown a modified laser diode L2 of the laser diode L1 in FIG. 1(A). In the modified laser diode L2 in FIG. 1(B), the light reflecting resin layer 11 is adapted to be spread over the entire surface of the sub-mount 3 as in 11' so as to protect the bonding pad portions of the aluminum wirings 5 and 6. Although not shown, the reflecting resin layer 11' may further be enlarged to protect the wires W1 to W3. Because other constructions and functions of the modified laser diode L2 are generally similar to those in the laser diode L1 of the first embodiment, a detailed description thereof is abbreviated here for reducing the amount of explanation.

Figure 3:
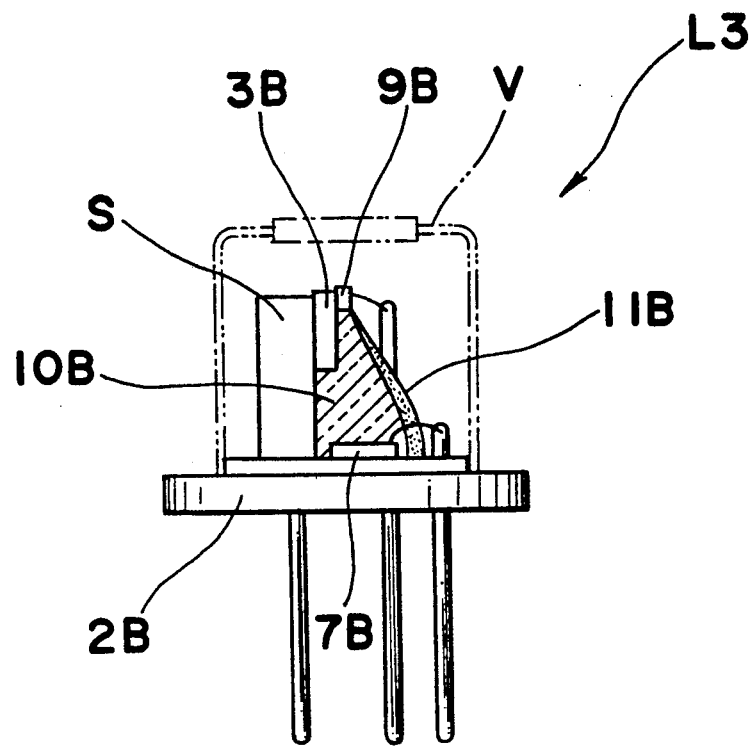
FIG. 3 is a side elevational view of a laser diode in a can-seal type according to another embodiment of the present invention.
Figure 4:
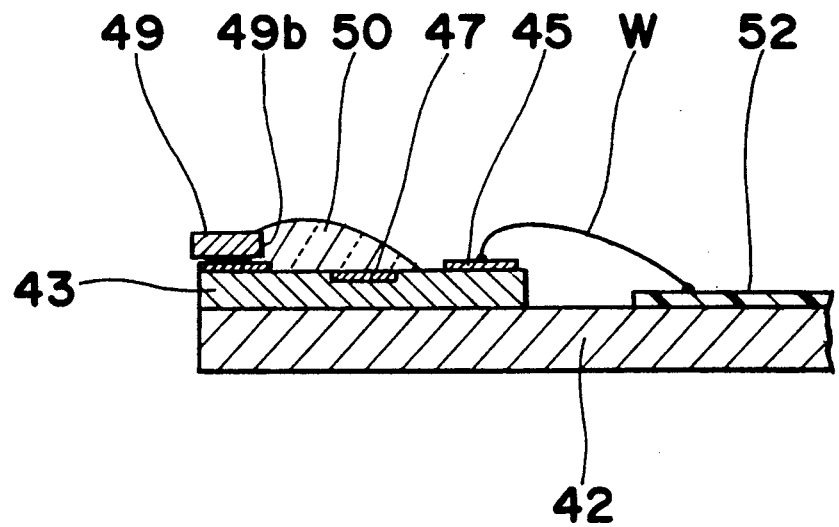
FIG. 4 is a fragmentary side sectional view of a conventional unit type laser diode (already referred to).

Referring further to FIG. 3, there is shown a laser diode L3 according to a second embodiment of the present invention as applied to a can-seal type laser diode.

In FIG. 3, the can-seal type laser diode L3 includes a stem S erected on a heat-sink 2B, a laser diode chip 9B bonded to the stem S through a sub-mount 3B, a monitor element 7B disposed on the upper surface of the heat-sink 2B separately from the sub-mount 3B, and a solid state waveguide 10B connecting the space between a rear or lower cleavage face of the laser diode chip 9B and the surface of the monitor element 7B with a reflecting resin layer 11B covering the surface of the waveguide 10B, and a can-seal V of a cylindrical shape with a bottom, applied over the upper surface of the heat-sink 2B for sealing.

In the above arrangement of FIG. 3, because the rear cleavage face of the laser diode chip 9B and the monitor element 7B are connected to each other by the solid state waveguide 10B, with the surface of the waveguide 10B being covered by the reflecting resin layer 11B, there is no possibility that the laser beam is transmitted out of the solid state waveguide, and thus, the amount of light incident upon the monitor element 7B can be increased.

As is clear from the foregoing description, according to the laser diode of the present invention, because the surface of the solid state waveguide is covered by the reflecting resin layer, the light amount incident upon the monitor element may be increased, with a consequent increase of the monitor current, while variation of the monitor current can also be prevented.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A laser diode system comprising:
   a substrate;
   a sub-mount disposed on a portion of said substrate having bonding pad portions formed on first predetermined portions of said sub-mount;
   a laser diode chip bonded on a portion of said sub-mount; and
   a monitor element formed on a second predetermined portion of said sub-mount, with a space between a rear cleavage face of said laser diode chip and the surface of said monitor element being covered by solid state waveguide means, the top surface of said solid state waveguide means being completely covered by a light reflecting resin layer and said light reflecting resin layer covering the entire surface of said sub-mount to protect said bonding pad portions.

2. A laser diode system as claimed in claim 1, wherein said solid state waveguide means is of a light-transmitting nature.

3. A laser diode system as claimed in claim 1, wherein said solid state waveguide means is of a semi-light transmitting nature.

4. A laser diode system as claimed in claim 1, wherein said solid state waveguide means is formed by applying the resin in a liquid state so as to cover both of the rear cleavage face and the surface of the monitor element for subsequent hardening of said resin.

5. A laser diode system as claimed in claim 1, wherein said light reflecting resin layer is formed by a resin dispersed with a light scattering agent therein.

6. A laser diode system comprising:
   a substrate;
   a sub-mount disposed on a portion of said substrate having bonding pad portions formed on first predetermined portions of said sub-mount;
   a monitor element formed on a second predetermined portion of said sub-mount;
   solid state waveguide means disposed in a space between a rear cleavage face of said laser diode chip and the surface of said monitor element for covering said rear cleavage face of said laser diode chip and said monitor element; and
   a light reflecting resin layer for completely covering the top surface of said solid state waveguide means and the entire surface of said sub-mount to protect said bonding pad portions.

7. A laser diode system as claimed in claim 6, wherein said solid state waveguide means is of light-transmitting nature.

8. A laser diode system as claimed in claim 6, wherein said solid state waveguide means is of semi-light transmitting nature.

9. A laser diode system as claimed in claim 6, wherein said solid state waveguide means is formed by applying the resin in a liquid state so as to cover both of the rear cleavage face and the surface of the monitor element for subsequent hardening of said resin.

10. A laser diode system as claimed in claim 6, wherein said light reflecting resin layer is formed by a resin dispersed with a light scattering agent therein.

11. A can-seal type laser diode system comprising:
    a heat sink;
    a stem disposed on a first portion of said heat sink;
    a sub-mount disposed on a portion of said stem;
    a laser diode chip bonded to said sub-mount;
    a monitor element disposed on a second portion of said heat sink;
    solid state waveguide means disposed in a space between a rear cleavage face of said laser diode chip and the surface of said monitor element for covering said rear cleavage face of said laser diode chip and said monitor element;
    a reflecting resin layer for completely covering the top surface of said waveguide means; and
    a can-seal of a cylindrical shape applied over the upper surface of said heat sink for sealing the laser diode system.

* * * * *